(12) United States Patent
Sato

(10) Patent No.: US 6,571,353 B1
(45) Date of Patent: May 27, 2003

(54) FAIL INFORMATION OBTAINING DEVICE AND SEMICONDUCTOR MEMORY TESTER USING THE SAME

(75) Inventor: Shinya Sato, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/444,300

(22) Filed: Nov. 22, 1999

(30) Foreign Application Priority Data

Dec. 11, 1998 (JP) .......................................... 10-353391
Oct. 1, 1999 (JP) .......................................... 11-282187

(51) Int. Cl.[7] .............................................. G06F 11/00
(52) U.S. Cl. ........................................ 714/7; 711/133
(58) Field of Search .............................. 714/7, 6, 8, 13, 714/25, 30, 31, 37, 42, 43; 711/133, 134

(56) References Cited

U.S. PATENT DOCUMENTS

| | | | | | |
|---|---|---|---|---|---|
| 5,604,710 A | * | 2/1997 | Tomishima et al. | .... | 365/230.03 |
| 5,825,783 A | * | 10/1998 | Momohara | .................. | 371/21.1 |
| 5,859,804 A | * | 1/1999 | Hedberg et al. | ............ | 365/201 |
| 5,978,291 A | * | 11/1999 | Kirihata | ....................... | 365/200 |
| 6,026,505 A | * | 2/2000 | Hedberg et al. | ............. | 714/711 |
| 6,034,905 A | * | 3/2000 | Suzuki et al. | ................ | 365/201 |
| 6,199,177 B1 | * | 3/2001 | Blodgett | ......................... | 714/7 |
| 6,233,184 B1 | * | 5/2001 | Barth et al. | .................. | 365/201 |
| 6,347,386 B1 | * | 2/2002 | Beffa | ........................... | 714/718 |

* cited by examiner

*Primary Examiner*—Nadeem Iqbal
(74) *Attorney, Agent, or Firm*—Rosenthal & Osha L.L.P.

(57) ABSTRACT

A semiconductor memory tester is provided. A memory controller inputs failed cell identification information. A memory specifies the location of a memory cell indicated by the information. A block fail memory stores a block specification information indicating a remedial block to which the memory cell indicated by the fail cell identification information belongs. A SBFM address selector outputs sub block identification information indicating the sub block to which the memory cell indicated by the failed cell identification information belongs. A fail information obtaining controller detects whether the memory cell indicated by the failed cell identification information belongs to the main cell are or not. A sub block fail memory stores sub block specification information indicating the sub block indicated by the sub block identification information, only when the failed memory cell belongs to the memory cell area.

20 Claims, 13 Drawing Sheets

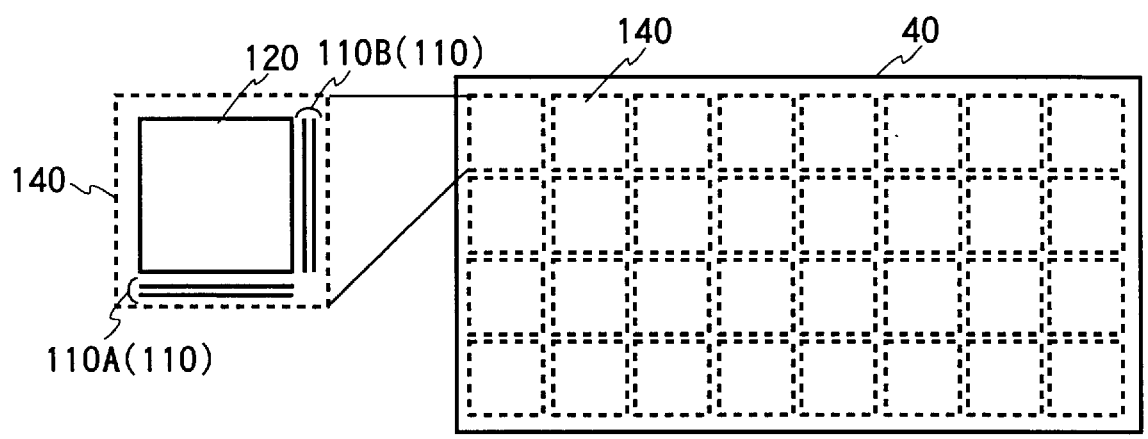
RELATED ART
FIG.1

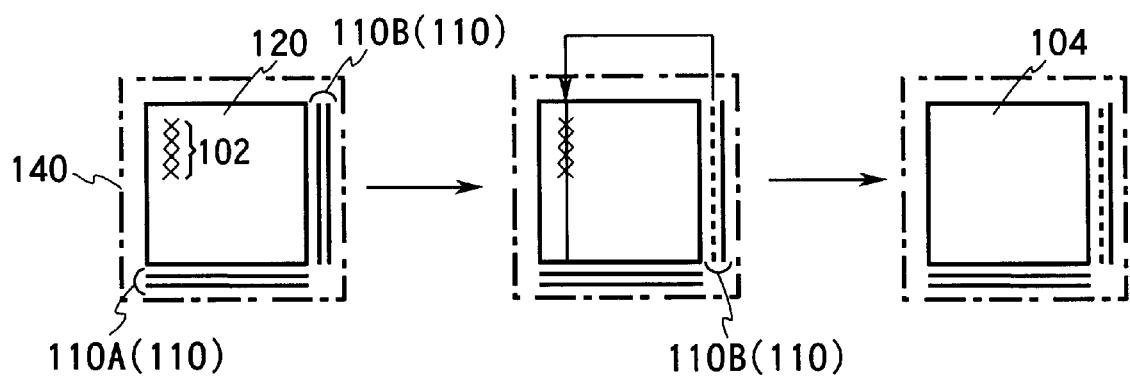
RELATED ART
FIG.2(a)
RELATED ART
FIG.2(b)
RELATED ART
FIG.2(c)

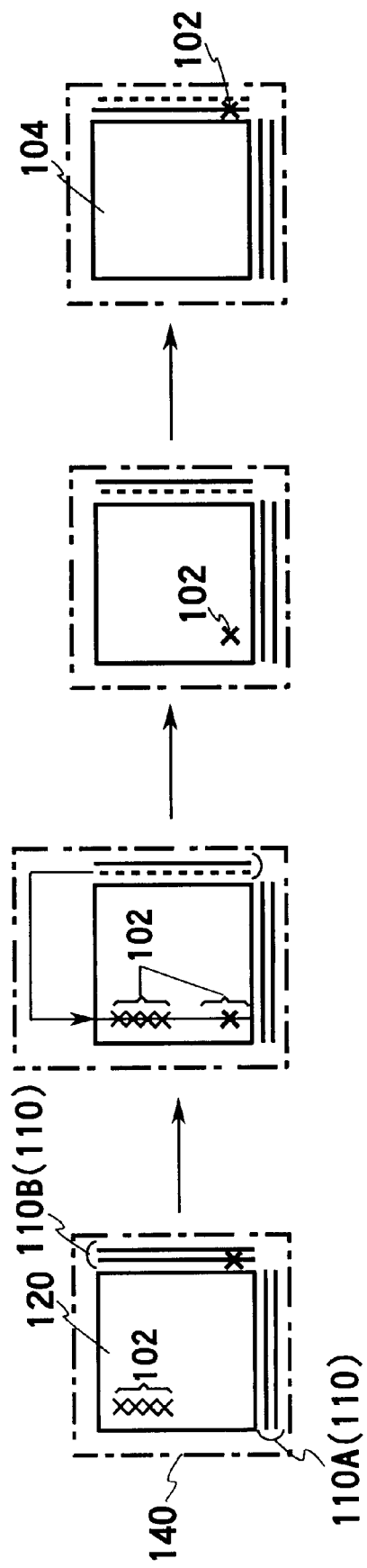

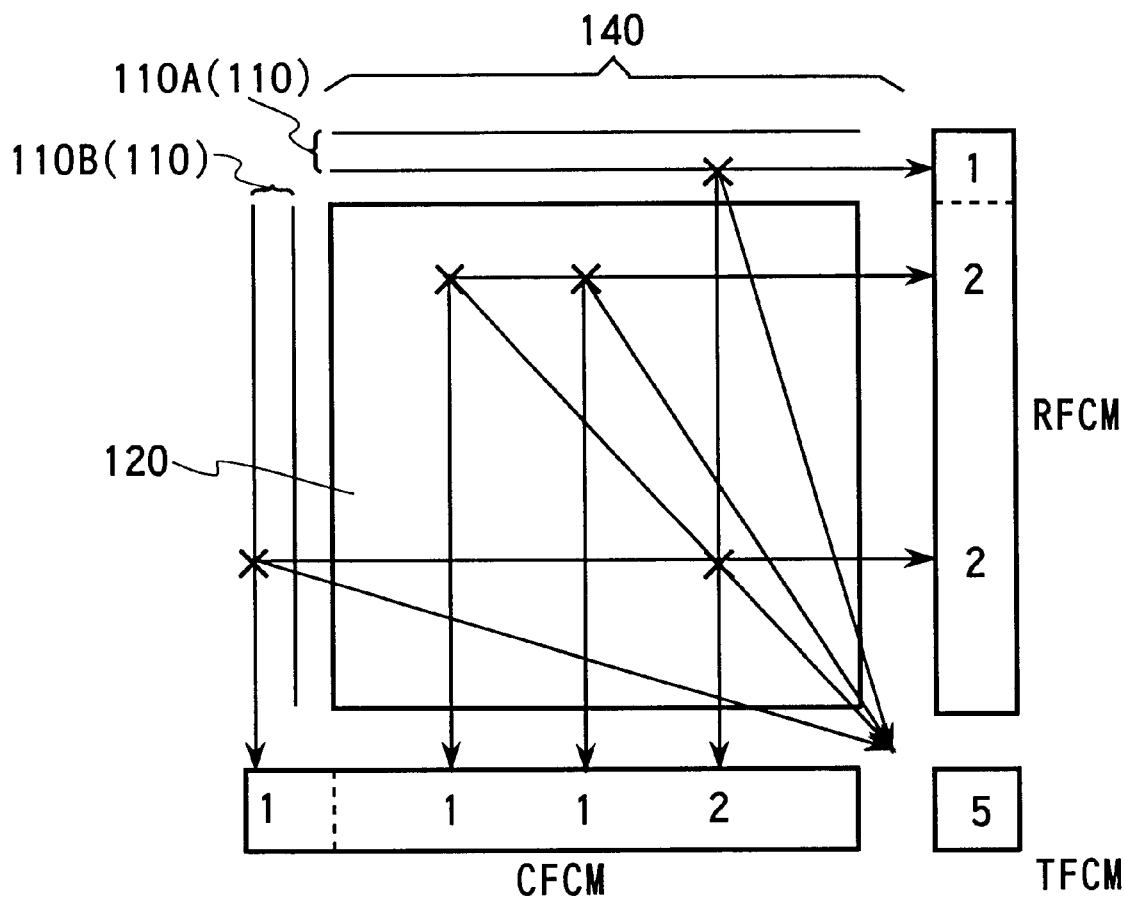
*RELATED ART*
*FIG.4*

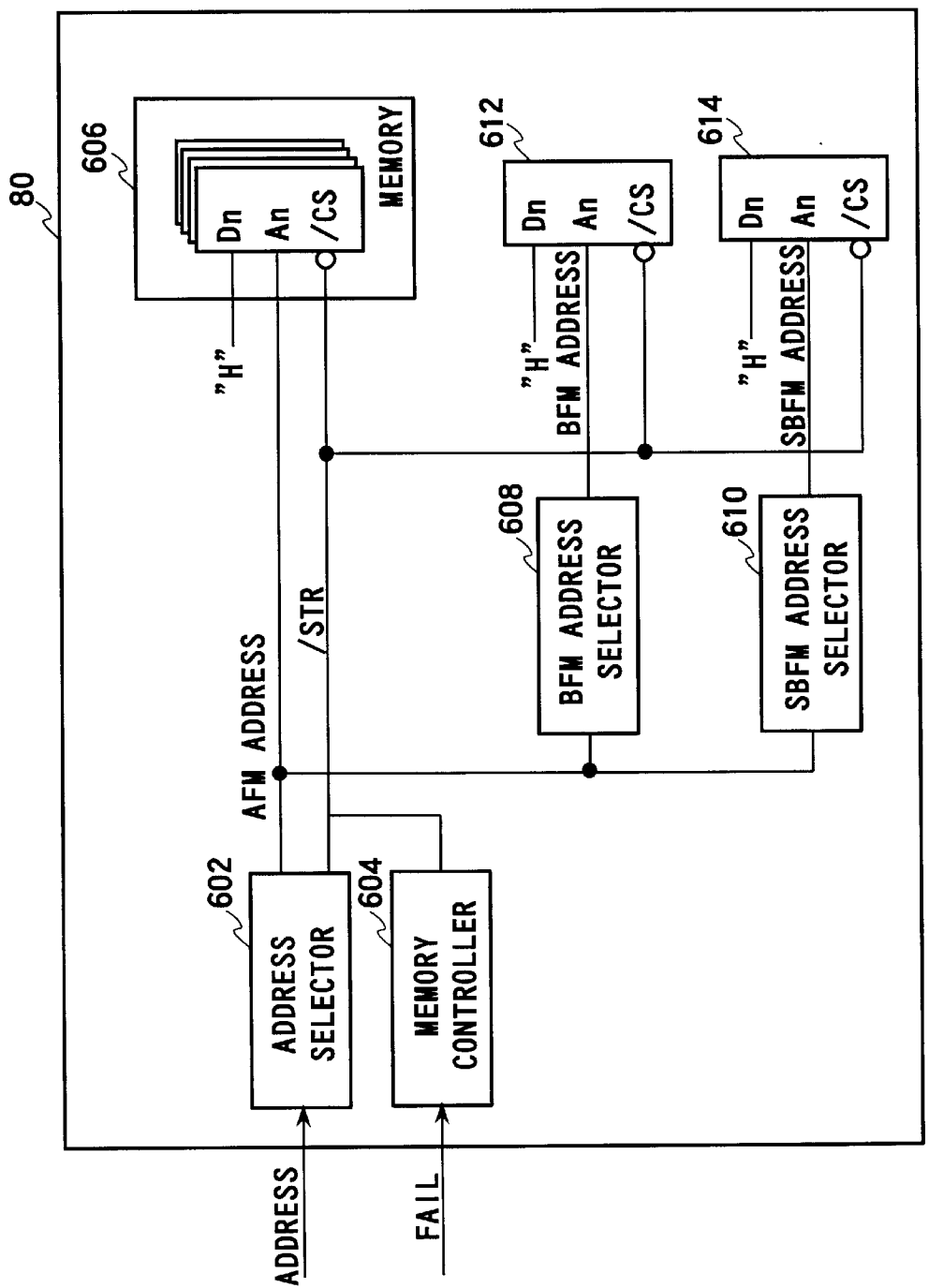
RELATED ART
FIG.5

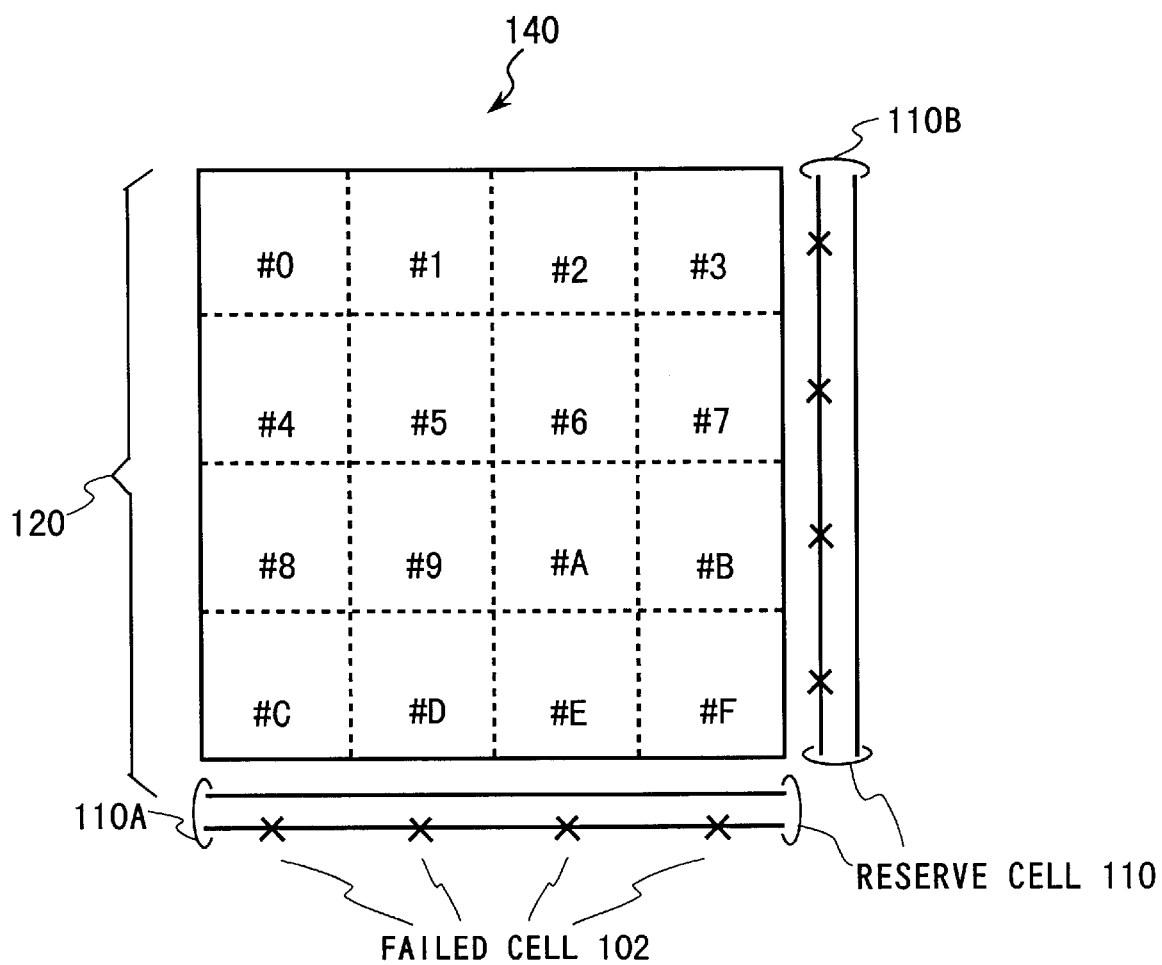
RELATED ART
FIG.6

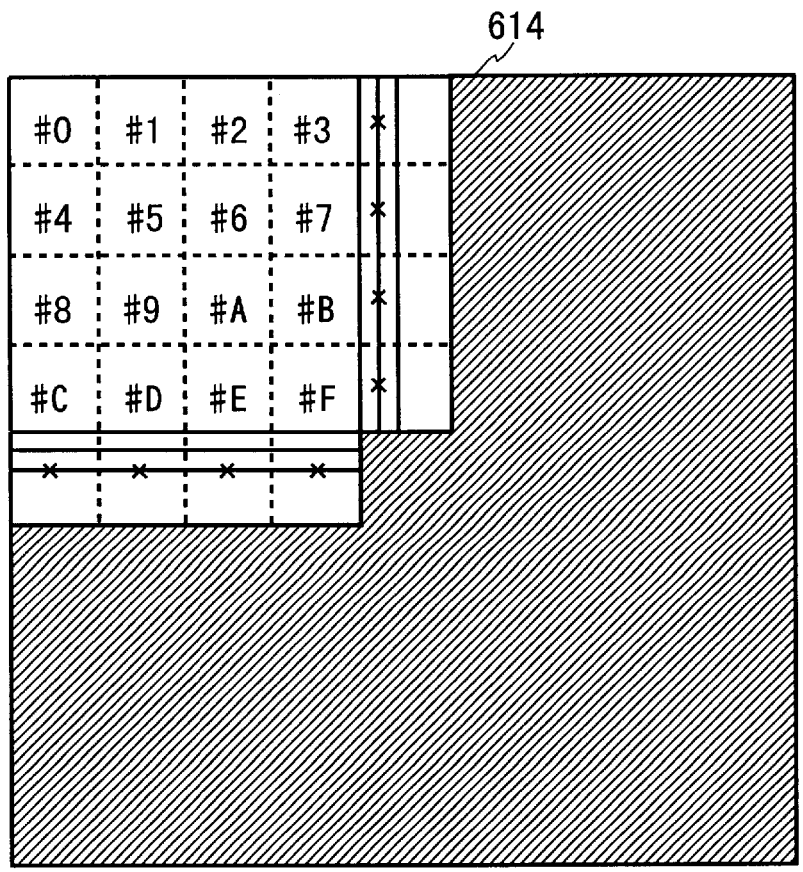
RELATED ART
FIG.7(a)
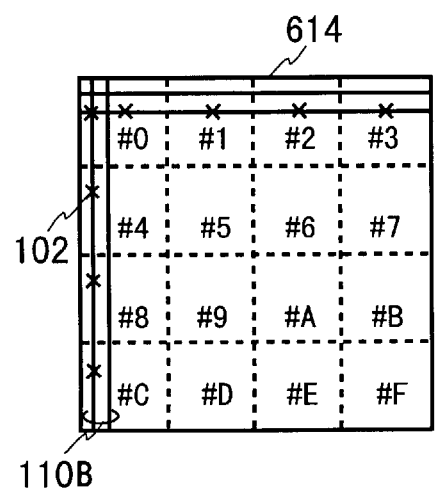
RELATED ART
FIG.7(b)

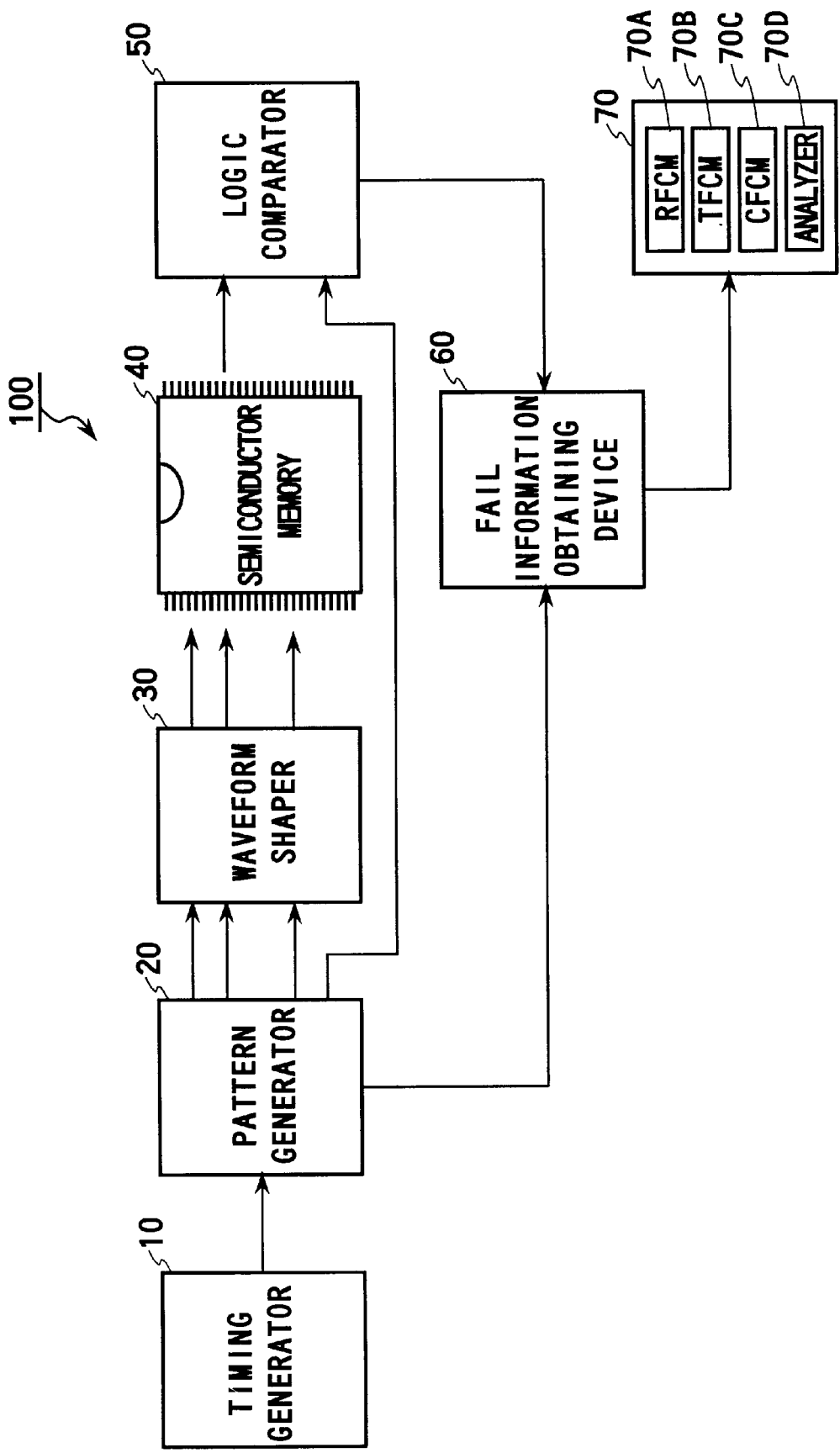
FIG. 8

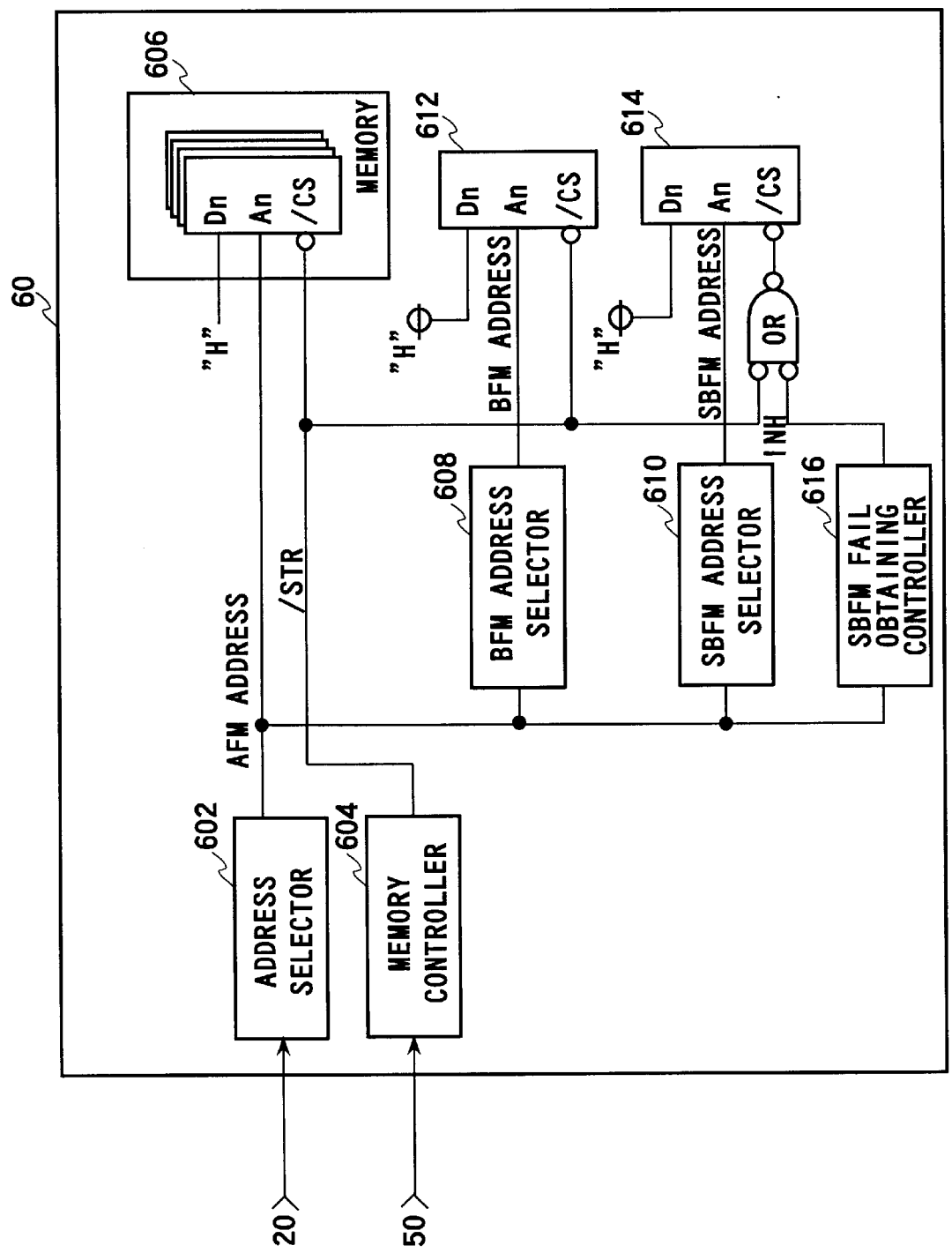
FIG. 9

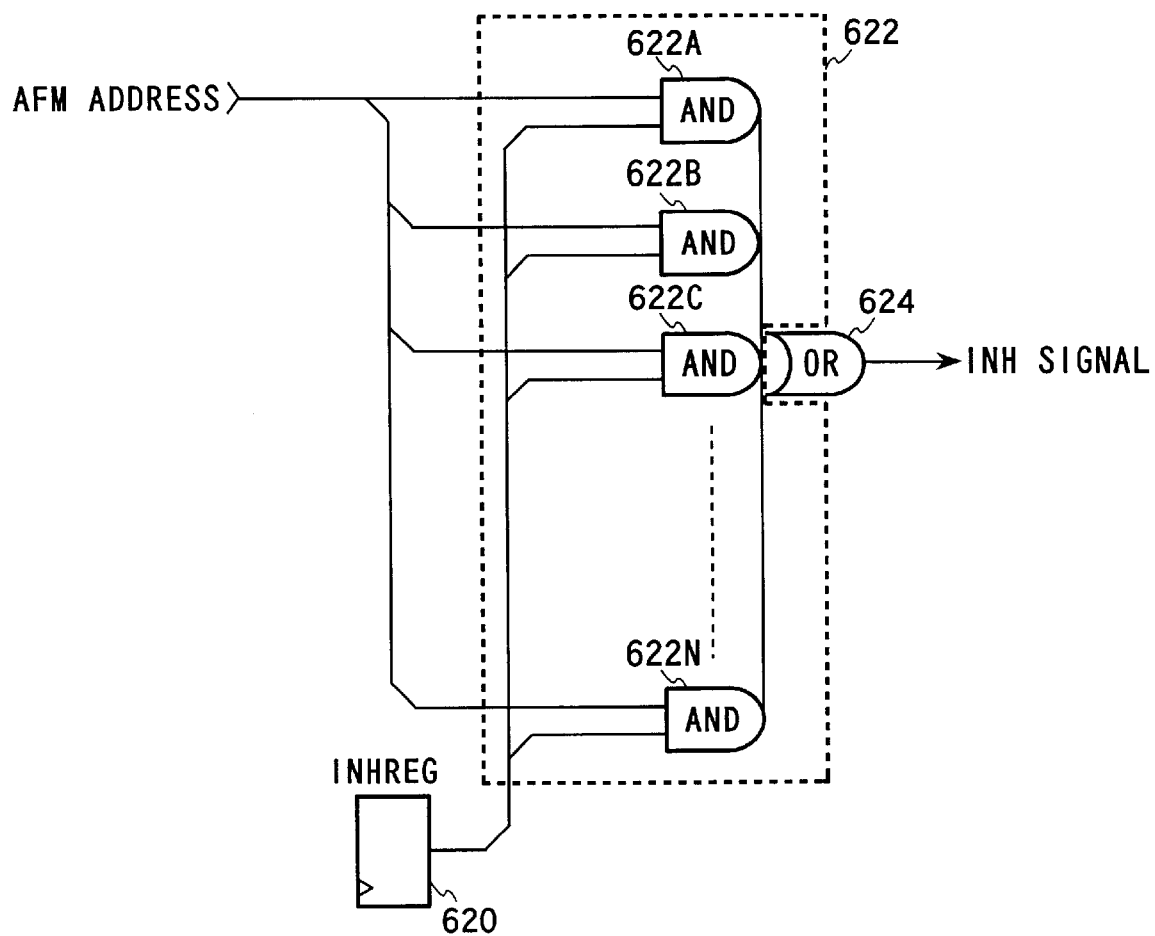
FIG. 10

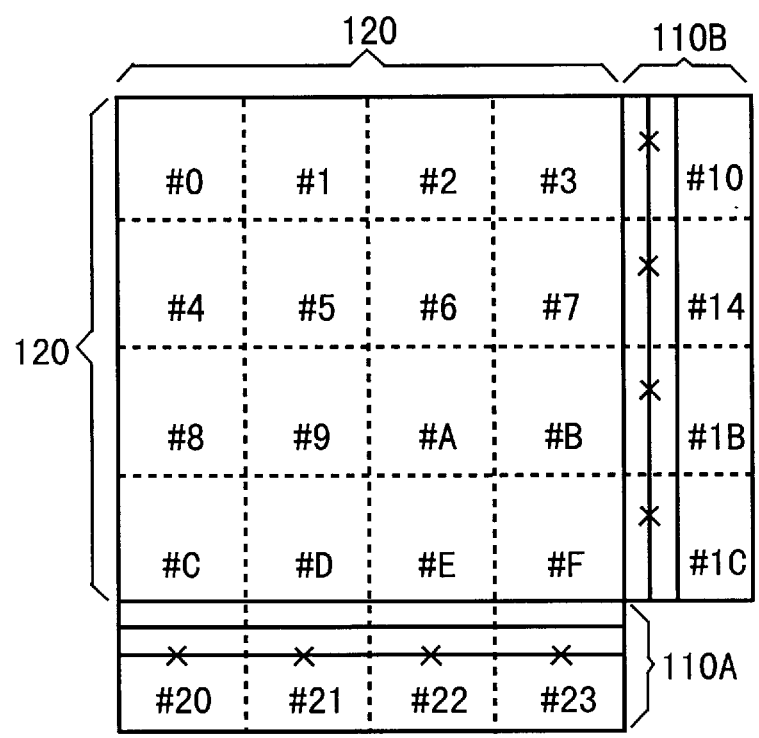
FIG. 11 (a)
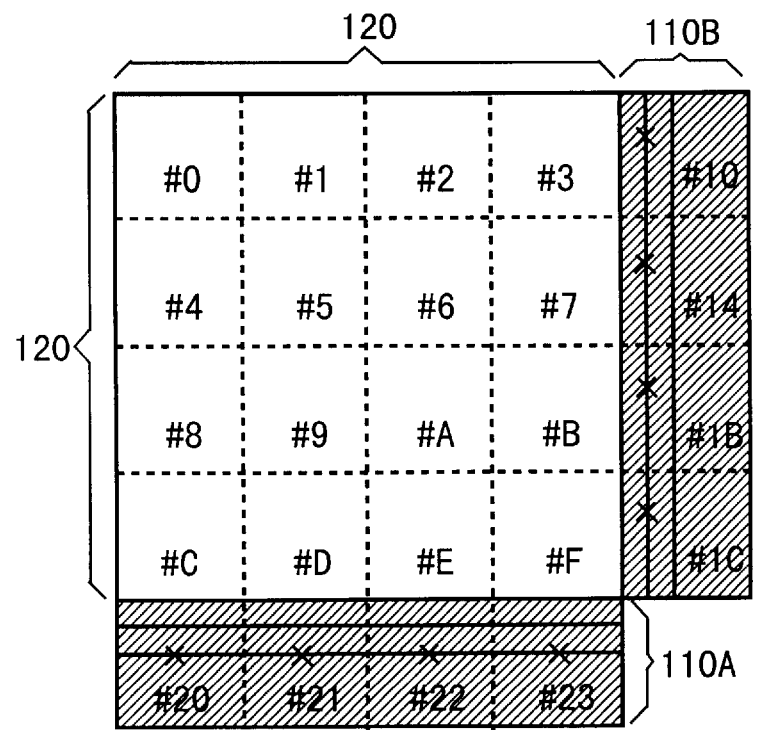
FIG. 11 (b)

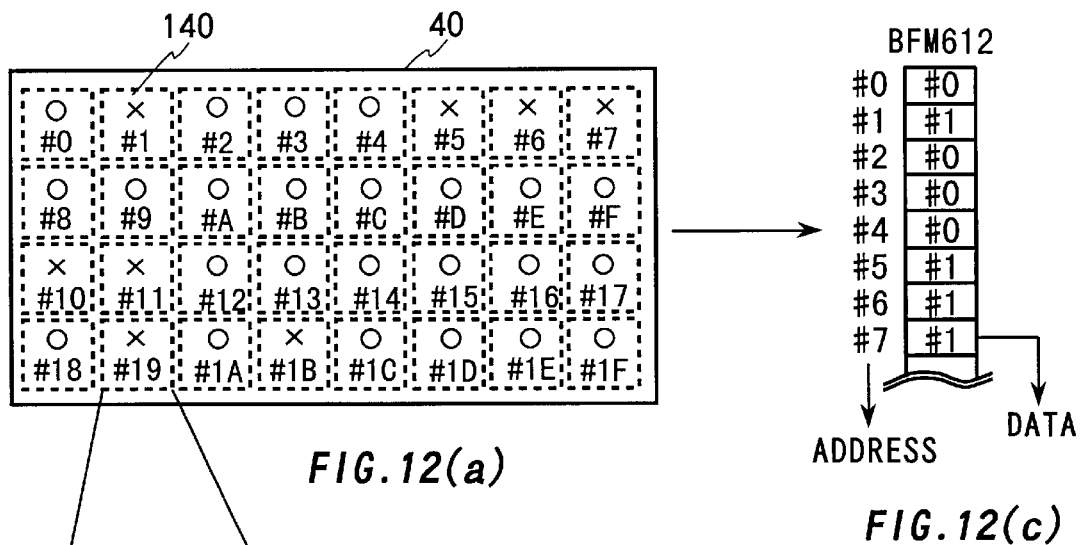
FIG.12(a)
FIG.12(c)
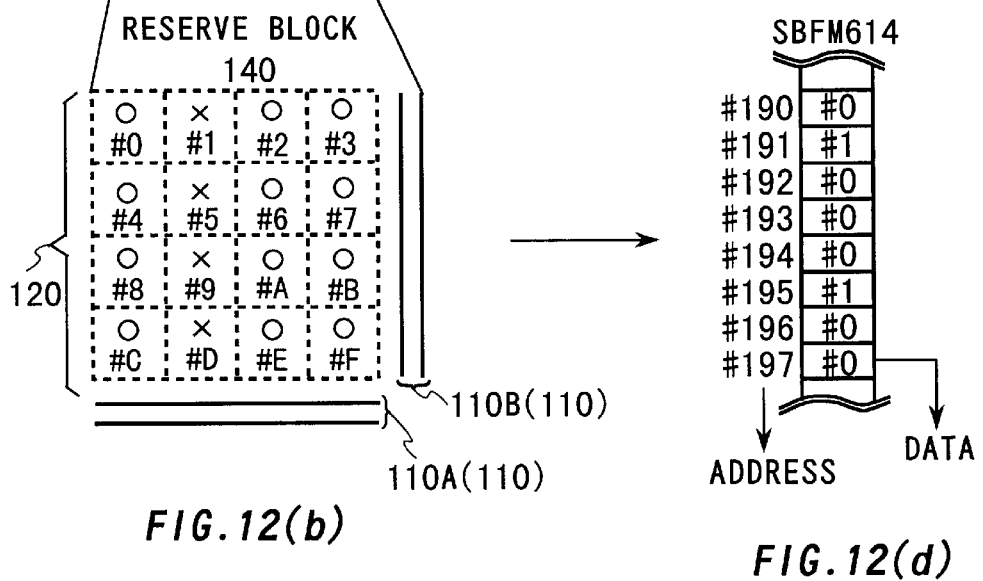
FIG.12(b)
FIG.12(d)

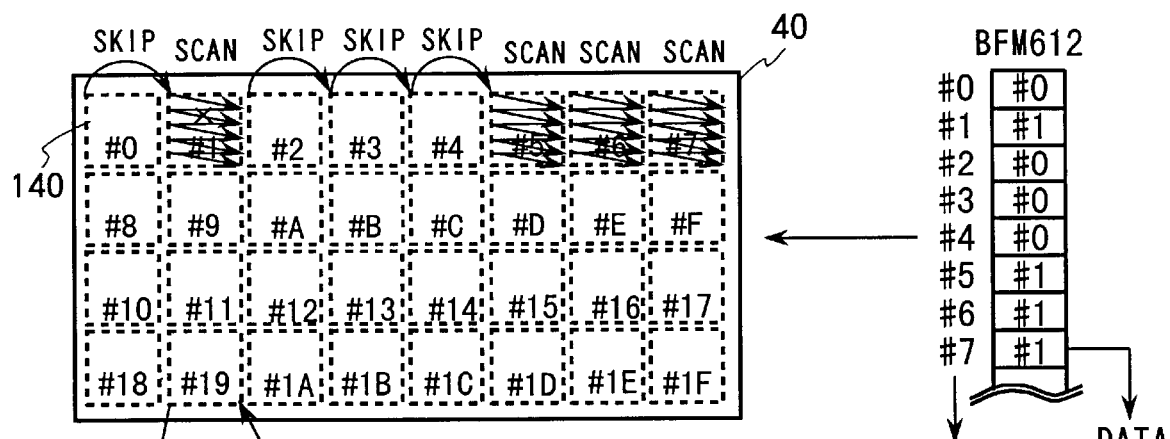
FIG.13(a)
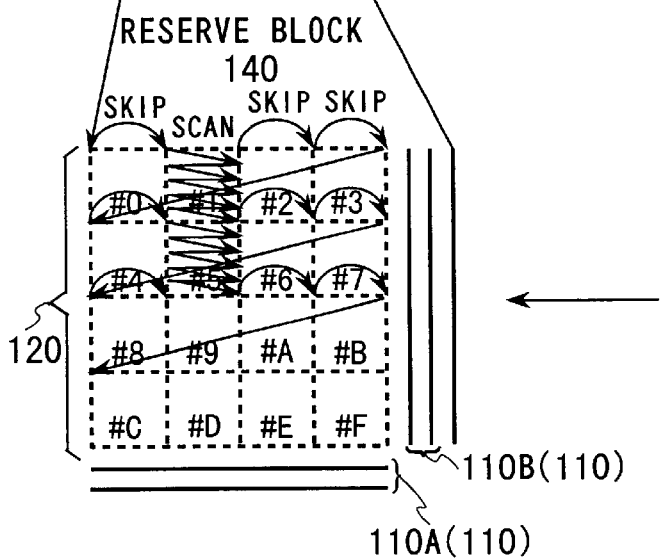
FIG.13(b)
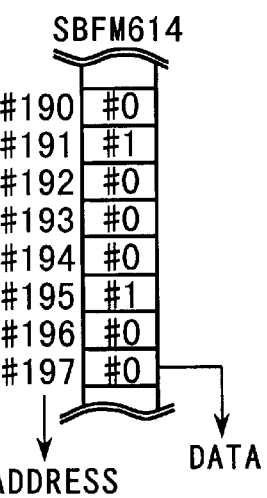
FIG.13(c)
FIG.13(d)

FAIL INFORMATION OBTAINING DEVICE AND SEMICONDUCTOR MEMORY TESTER USING THE SAME

This patent application claims priority based on Japanese patent applications H10-353391 filed on Dec. 11, 1998 and H11-282187 filed on Oct. 1, 1999, the contents of which are incorporated herein by reference.

BACKGROUND OF THE INVENTION

1. Field of Invention

This invention relates to a semiconductor memory tester, and a method of testing semiconductor memory. This invention in particular relates to a semiconductor memory tester and a fail information obtaining or storing device for acquiring information when a memory fails, which can be used for a semiconductor memory tester.

2. Description of Related Art

FIG. 1 shows a configuration of a semiconductor memory 40. The semiconductor memory 40 may be a DRAM (Dynamic Random Access Memory). The semiconductor memory 40 comprises a plurality of memory blocks with remedial block 140, which will be referred to as remedial blocks 140. In addition to the main cell area 120, the remedial blocks 140 further comprise a reserve cell area 110 having a spare column 110B and a spare row 110A. The spare column 110B has a plurality of reserve memory cells that will be used to replace failed cells in the column direction. The spare row 110A has a plurality of reserve memory cells to be regressed to failed cells in the row direction.

FIGS. 2(a), 2(b) and 2(c) show the replacement of the failed cells in the reserve cells of the semiconductor memory 40. As shown in FIG. 2(a), the main cell area 120 has a plurality of failed cells 102 which cannot store data correctly. The failed cells 102 shown as "x" exist in the column direction. The memory cell line having the failed cell 102 in the column direction is replaced by a line of the spare column 110B as shown in FIG. 2(b).

In this process, the fuse in an address line corresponding to a line having failed cells 102 is cut by laser. The fuses in address lines of the spare column 110B are cut by laser so that the spare column 110B will be selected when an address corresponding to a replaced failed line is accessed. The failed cells 102 are replaced with normal cells as shown in FIG. 2(c). Following this replacement, the semiconductor memory 40 becomes a normal chip having no failed cells.

FIGS. 3(a) to 3(d) show another method of replacing the failed cells with the reserve cells. The main cell area 120 has a plurality of failed cells 102 in the column direction and the spare column 110B also has one failed cell 102 as shown in FIG. 3(a). If the spare column 110B is replaced with a line having a failed cell 102 in its column direction as shown in FIG. 3(b), the replaced line will have one failed cell as shown in FIG. 3(c). To avoid this situation, the line having failed cells 102 in its column direction, must be replaced with a line from the spare column 110B having no failed cells 102, as shown in FIG. 3(d).

Regarding a semiconductor memory tester, a memory cell function test is usually conducted not only on memory cells in the main cell area 120 but also on memory cells in the reserve cell area 110. The test result is usually stored in a memory of a fail information obtaining or storing device provided in the semiconductor memory tester. Appropriate remedial replacement is undertaken based on the test result.

FIG. 4 shows the process and analysis on failed memory cells in an analyzer and semiconductor tester. Information concerning the failed memory cells in the main cell area 120 and reserve cell area 110 is assumed to have already been tested by the tester and to have been stored in the memory of the fail information obtaining device (not shown).

The analyzer counts failed cells based on the test results in the low addresses for each block and stores the count in a RFCM (row fail count memory). The analyzer also counts failed cells in column addresses and stores it in a CFCM (column fail count memory). The total number of failed cells is also counted and is stored in a TFCM (total fail count memory). This counting process is undertaken by a SCAN operation.

The analyzer then conducts a SEARCH operation. The analyzer analyzes the memory cell lines in the main cell area 120 and reserve cell area 110 for correct replacement, based on the fail counts stored in the RFCM, CFCM and TFCM.

It takes-considerable time to count the failed cells in the above SCAN operation, as the analyzer reads all memory cells stored in the fail information obtaining device when assessing whether or not a certain memory cell is failed. The time necessary for this operation increases as the capacity of the semiconductor memory 40 increases.

To shorten the time necessary for the analysis, a fail information obtaining device 80 is known.

FIG. 5 shows the configuration of the fail information obtaining device 80. The fail information obtaining device 80 comprises an address selector 602, a memory controller 604, a memory 606, a BFM (block fail memory) 612, an SBFM (sub block fail memory) 654, a BFM address selector 608 and an SBFM address selector 610. The memory 606 comprises a plurality of memory elements, each having a predetermined memory capacity.

The address selector 602 selects and outputs an AFM address corresponding to a memory cell in the semiconductor memory 40 under test, based on the address input from a pattern generator (not shown). When a fail signal indicating a memory cell in the semiconductor memory 40 is failed, is input from the logic comparator; the memory controller 604 selects a memory element in the memory 606 to store the fail information, and asserts a fail obtaining signal /STR to be low or "0".

The memory 606 stores as the fail information the logic level H (high) or "1" input via the terminal Dn. The data "1" is stored to a slot corresponding to the AFM address input via the terminal An, when the fail obtaining signal /STR is "L" or low. The fail obtaining signal /STR is input from the memory controller 604 via the terminal /CS.

The BFM address selector 608 selects an address of the remedial block 140 to which the memory cell indicated by the AFM address belongs. This selection is made based on the AFM address input from the address selector 602. The BFM 612 stores as the fail information, the logic H or "1", input via the terminal Dn. The data is stored in a slot corresponding to an address input from the BFM address selector 608 via the terminal An. This occurs when the fail obtaining signal /STR is L, input from the memory controller 604 via the terminal /CS The SBFM address selector 610 selects an address of a sub block of the remedial block 140 to which the memory cell indicated by the AFM address belongs This selection is made based on the AFM address input from the address selector 602. The SBFM 614 stores as the fail information the logic signal H or "1", input via the terminal Dn. The data "1" is stored in a slot corresponding to an address input from the SBFM address selector 610 via the terminal An. This occurs when the fail obtaining signal /STR input from the memory controller 604 via the terminal /CS is "0". There are two different ways for the SBFM address selector 610 to select the address. The SBFM 614 writes the information in a different way for each of the two different methods.

FIG. 6 shows one example of a failed memory cell in the remedial block 140. The remedial block 140 has a plurality of failed cells 102 both in the spare column 110B and spare row 110A.

FIGS. 7(*a*) and 7(*b*) show a conventional way for the SBFM 614 to obtain the fail information of the remedial block 140 shown in FIG. 6 In FIG. 7(*a*), the fail information concerning the spare column 110B and spare row 110A is stored independently of the fail information of the sub block of the main cell area 120. Conversely, in FIG. 7(*b*), the fail information concerning the spare column 110B and spare row 110A is stored in the same area as the fail information of the sub blocks of the main cell area 120.

In the above fail information obtaining device 80, the time necessary for the analysis of the semiconductor memory 40 can be reduced by using the memory 606, BFM 612 and SBFM 614. In this device, the BFM 612 can indicate the remedial blocks 140 having a failed cell. The SBFM 614 indicates sub blocks having a failed cell in the remedial blocks 140. The analyzer reads the fail information with regard to each memory cell in the memory 606 concerning the indicated sub block, whereas it skips reading out the information of each memory cell in the sub blocks and the remedial blocks 140 when there are no failed memory cells. This skip/SCAN operation can reduce the total time necessary for the analysis.

In the conventional fail information obtaining device 80, it is necessary to provide an extra area for the storage of fail information concerning the sub blocks of the reserve cell area 110. This extra area is in addition to the area for the sub blocks of the main cell area 120 required when the method shown in FIG. 7(*a*) is adopted, that is, where the fail information is stored in the SBFM 614. In general, the number of sub blocks in the main cell area 120 is $2^N$ and the memory used for the SBFM 614 comprises $2^N$ bits memory area.

In this device, it is necessary to provide an area four times larger than normal in order to store all the fail information. The memory efficiency for this configuration is low because the unusable area shown as the hatched area in FIG. 7(*a*) is large.

Conversely, when adopting the method shown in FIG. 7(*b*), unnecessary fail information corresponding to the sub blocks including the failed cells in the reserve cell area 110 will be stored even when the sub blocks in the main cell area 120 have no failed cells. These areas are shown as #0, #1, #2, #3, #4, #8 and #C in FIG. 7(*b*). Due to this unnecessary storage of fail information in the SBFM 614, the SCAN operation must be conducted over all memory cells in the areas #0 etc. This results in a longer analysis operation.

SUMMARY OF THE INVENTION

It is thus the object of the present invention to provide devices and methods for semiconductor memory testing, which reduce the time necessary for the analysis of failed memory cells and which require relatively small memory capacity for storing the fail information. This object is achieved by combinations described in the independent claims. The dependent claims define further advantageous and exemplary combinations of the present invention.

According to one aspect of the present invention, a device (80) for obtaining, or more specifically for storing, fail cell identification information of a semiconductor memory (140) is provided. The memory has blocks with remedial function or remedial blocks. The blocks include a main cell area (120) having memory cells and a reserve cell area (110) having reserve cells for replacing failed memory cells. The fail cell identification information indicates a failed memory cell. The device comprises: an input section (602, 604) for inputting the fail cell identification information; a memory (606) for storing fail cell specification information to specify location of a failed memory cell indicated by the fail cell identification information; a block information memory (612) for storing block specification information indicating a remedial block to which the failed memory cell indicated by the fail cell identification information belongs; a sub block identification information selector (610) for outputting sub block identification information indicating a sub block of the remedial block to which the failed memory cell belongs, indicated by the fail cell identification information; a detector (616) for detecting whether the failed memory cell indicated by the fail cell identification information belongs to the main cell area; and a sub block information memory (614) for storing a sub block specification information specifying the sub block indicated by the sub block identification information when the failed memory cell indicated by the fail cell identification information is detected to belong to the main cell area.

In this configuration, the sub block specification information is not stored in the sub block information memory when the failed memory cell does not belong to the main cell area.

According to another aspect of the present invention, a semiconductor memory tester is provided. The memory (40) has blocks with remedial function or remedial blocks. These blocks have a main cell area (120) that has memory cells and a reserve cell area (110) that has reserve cells for replacing failed memory cells. The tester may employ the aforementioned fail information obtaining device.

The tester comprises: a pattern generator (20) for generating a test pattern to apply to the semiconductor memory, identification information corresponding to the memory cells in the semiconductor memory and expected data to be output therefrom when the memory cells are normal; a waveform shaper (30) for shaping the test pattern signal; a logic comparator (50) for comparing output data output from the semiconductor memory when the shaped test pattern is applied thereto and the expected data; an input section (602, 604) for inputting the identification information as fail cell identification information when the output data and the expected data mismatch; a memory (606) for storing fail cell specification information to specify the memory call indicated by the fail cell identification information; a block information memory (612) for storing block specification information indicating a remedial block to which the failed memory cell indicated by the fail cell identification information belongs; a sub block identification information selector (610) for outputting sub block identification information indicating a sub block of the remedial block to which the failed memory cell belongs, indicated by the fail cell identification information; a detector (616) for detecting whether the failed memory cell indicated by the fail cell identification information belongs to the main cell area; and a sub block information memory (614) for storing a sub block specification information specifying the sub block indicated by the sub block identification information when the failed memory cell indicated by the fail cell identification information is detected to belong to the main cell area.

In this configuration, the sub block specification information is not stored in the sub block information memory when the failed memory cell does not belong to the main cell area.

In the above device or tester, the sub block information memory (614) may store the sub block specification information, utilizing an address bit corresponding to the sub block identification information output. The selector (610) may select as the sub block identification information a plurality of predetermined bits of the fail cell identification information. The detector (616) may detect whether the failed memory cell belongs to the main cell area, based on a predetermined bit of the fail cell identification information.

The detector (616) may comprise a logical AND circuit (622) for calculating logical AND of the predetermined bit of the fail cell identification information and a predetermined logic value. It may be detected whether the failed memory cell indicated by the fail cell identification information belongs to the main cell area (120) or not, based on result of the logical AND operation. The predetermined bit is a bit the value of which becomes constant for addresses inside or outside the main cell area.

According to still another aspect of the present invention, a method of obtaining or storing fail cell identification information of a semiconductor memory (140) is provided. The method comprises: obtaining the fail cell identification information; storing fail cell specification information to specify location of a failed memory cell indicated by the fail cell identification information; storing information indicating a remedial block to which the failed memory cell indicated by the fail cell identification information belongs; obtaining sub block identification information indicating a sub block of the remedial block to which the failed memory cell belongs indicated by the fail cell identification information; detecting whether the failed memory cell indicated by the fail cell identification information belongs to the main cell area or not; and specifying the sub block indicated by the sub block identification information when the failed memory cell indicated by the fail cell identification information is detected to belong to the main cell area.

According to yet another aspect of the present invention, a method for analyzing a semiconductor memory (140) is provided. This method may employ the above method of obtaining or storing fail cell identification information. The method comprises: reading out pre-recorded block specification information indicating a remedial block to which the failed memory cell indicated by the fail cell identification information belongs; analyzing, based on pre-recorded fail memory cell identification information, the reserve memory cell in the remedial block corresponding to the block specification information; reading out, out of pre-recorded sub block specification information indicating a sub block having a remedial block having a main cell area including a failed memory cell therein, a sub block specification information indicating a sub block having a remedial block corresponding to the block specification information, the remedial block having a main cell area including a failed memory cell therein; and analyzing, based on the failed memory cell identification information, the failed memory cell in the main cell area in the sub block corresponding to the read sub block specification information.

This method may further comprise detecting the reserve memory cell in the reserve cell area to replace the failed memory cell in the main cell area, based on the analysis of the reserve memory cell in the reserve cell area and the analysis of the failed memory cell in the main cell area.

This summary of the invention does not necessarily describe all necessary features so that the invention may also be a sub-combination of these described features.

BRIEF DESCRIPTION OF THE DRAWINGS

FIG. 1 shows a configuration of a semiconductor memory,

FIGS. 2(a), 2(b) and 2(c) show a remedial operation of a semiconductor memory that has a failed memory cell, FIGS. 3(a), 3(b), 3(c) and 3(d) show another remedial operation of the semiconductor memory, FIG. 4 shows a SEARCH operation of a failed memory cell, FIG. 5 shows a configuration of a conventional fail information obtaining device, FIG. 6 shows a failed memory cell in a remedial block of a semiconductor memory, FIGS. 7(a) and 7(b) show a conventional data management of SBFM, FIG. 8 shows a configuration of a memory tester according to one embodiment of the present invention, FIG. 9 shows a configuration of a fail information obtaining device according to one embodiment of the present invention, FIG. 10 shows a configuration of an SBFM fail information controller, according to one embodiment of the present invention, FIGS. 11(a) and 11(b) show a storing operation of the SBFM fail information, according to one embodiment of the present invention, FIGS. 12(a), 12(b), 12(c) and 12(d) show a fail information obtaining operation according to one embodiment of the present invention, and FIGS. 13(a), 13(b), 13(c) and 13(d) show a remedial analysis operation on a semiconductor memory according to one embodiment of the present invention.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

FIG. 8 illustrates a basic composition of one embodiment of a semiconductor memory tester 100 according to the present invention. The tester 100 tests a semiconductor memory 40 shown in FIG. 1. The tester 100 comprises a timing generator 10, a pattern generator 20, a waveform shaper 30, a logic comparator 50, a fail information obtaining or storing device 60, and a remedial analyzer 70.

The timing generator 10 generates a reference clock that is used for generating a test pattern signal given to the semiconductor memory 40, and outputs the clock to the pattern generator 20. The pattern generator 20 generates a test pattern signal and expected data. This test pattern signal may be any kind of signal applied to the semiconductor memory 40 to test its memory cells, including a test data signal, a control signal and address signals etc. The expected data comprises an expected value a functionally correct semiconductor memory 40 will output when the test pattern signal is applied thereto. Synchronized with the reference clock, the pattern generator 20 outputs the test pattern signal to the waveform shaper 30, the expected data to the logic comparator 50, and the address included in the test pattern signal to the fail information obtaining device 60.

The waveform shaper 30 shapes the test pattern signal input from the pattern generator 20 and outputs the shaped waveform to the semiconductor memory 40. The logic comparator 50 compares output data from the semiconductor memory 40 with the expected data input from the pattern generator 20. The logic comparator 50 then judges whether the memory cell is normal or failed. The logic comparator 50 outputs a fail signal to the fail information obtaining device 60 when the expected data and the output data do not match.

The fail information obtaining device 60 stores the fail information based on the address input from the pattern generator 20; when fail information is input from the logic comparator 50.

The remedial analyzer 70 Analyzes a memory cell line in the main cell area 120 to be replaced, and a memory cell line of the reserve cell area 110. This analysis is based on the fail information stored in the device 60. The analyzer 70 Comprises an RFCM 70A for storing the number of failed cells in row addresses for each remedial block 140, a CFCM 70C for storing the number of failed cells in column addresses for each remedial block 140 and a TFCM 70B for storing the total number of failed cells for each remedial block 140. The analyzer 70 further comprises an analyzing section 70D, which counts the number of failed cells and stores the data in the RFCM 70A, TFCM 70B and CFCM 70C. The analyzing section 70D analyzes a line in the main cell area 120 to be replaced, and lines in the reserve cell area 110, based on the counts in the RFCM 70A, TFCM 70B and CFCM 70C. The analyzing section 70D conducts the remedial replacement based on the results of the analysis.

FIG. 9 shows a configuration of one embodiment of the fail information obtaining device 60. The device 60 comprises an address selector 602, a memory controller 604, a memory 606, a BFM 612, an SBFM 614, a BFM address selector 608, an SBFM address selector 610, an SBFM fail information obtaining controller 616 and a logical OR 618.

The input section mentioned in the claims may correspond to the address selector 602 and the memory controller 604. The block information memory may be the BFM 612, and the sub block identification information selector may be mainly comprised of the SBFM address selector 610 . The detector may be mainly comprised of a SBFM fail information obtaining controller 616. The sub block information memory may be mainly comprised of the SBFM 614.

The address selector 602 selects and outputs an AFM address corresponding to a memory cell of the semiconductor memory 40, based on the address input from the pattern generator 20. The memory controller 604 selects a memory element to store the fail information out of a plurality of memory elements in the memory 606. The memory controller 604 then asserts the fail obtaining signal /STR for the selected memory element to be low when the fail signal indicating the memory cell is failed is input from the logic comparator 50.

The memory 606 comprising a plurality of memory elements having a predetermined memory capacity, stores the fail information indicating whether each memory cell is failed or normal. The memory 606 in this embodiment stores as the fail information, logic H input via the terminal Dn. This is stored to a slot or location corresponding to the AFM address input from the address selector 602 via the terminal An, when the fail obtaining signal /STR is L input from the memory controller 604 via the terminal /CS.

The BFM address selector 608 selects an address of the remedial block 140 to which the memory cell indicated by the AFM address belongs, based on the AFM address input from the address selector 602. The BFM 612 stores the fail information indicating where there is a failed cell for each remedial block 140. The 612 in this embodiment stores as the fail information, logic H value input via the terminal Dn. This is stored to a location corresponding to the remedial block address input from the BFM address selector 608 via the terminal An, and occurs when the fail obtaining signal /STR is L, when there is a failed cell in the remedial block 140.

The SBFM address selector 610 selects an address of a sub block of the remedial block 140 to which the memory cell indicated by the AFM address belongs, based on the AFM address input from the address selector 602. The SBFM fail information obtaining controller 616 detects whether the memory cells corresponding to the AFM address belong to the reserve cell area 110 based on the AFM address input from the address selector 602. The SBFM fail information obtaining controller 616 outputs a signal INH as H or "1" when the memory cell is detected as belonging to the reserve cell area 110.

The OR 618 outputs a signal to inhibit storage in the SBFM 614 of the fail information of the sub block to which the memory cell belongs. This occurs when the memory cell is detected to belong to the reserve cell area 110. The OR 618 in this embodiment outputs the logic OR between the fail obtaining signal /STR input from the memory controller 604 and the signal INH input from the SBFM fail information obtaining controller 616. The OR 618 outputs the logic L or "0" to activate the SBFM 614 when both the fail obtaining signal /STR and the signal INH are L. Otherwise, the OR 618 outputs H to deactivate the SBFM 614.

The SBFM 614 stores the fail information, indicating whether there is a failed cell in the sub block belonging to the main cell area 120 of the remedial block of the semiconductor memory 40. The SBFM 614 in this embodiment stores as the fail information the logic H input via the terminal Dn. This is stored to a location corresponding to the sub block address input from the SBFM address selector 610 via the terminal An, and occurs when the signal input from the OR 618 via the terminal /CS is L, when the memory cell in the main cell area 120 is failed.

According to one embodiment of the present invention, FIG. 10 shows a configuration of the SBFM 616. The SBFM 616 comprises a register INHREG 620, a plurality of logical AND circuits 622 (622a to 622n) and a logical OR circuit 624.

The INHREG 620 outputs logic H to some of the AND circuits 622, to each of which the corresponding AMF address bit is applied as "1" when the memory cell belongs to the reserve cell area, and outputs logic L to the other AND circuits 622 corresponding to the other AFM address bits. The ANDs 622 (622a to 622n) output the logical AND between the AFM address bit input from the address selector 602 and the logic value input from the 620. In this configuration, at least one of the AND circuits 622 to which the INHREG 620 applies "1" output logic H when the input AFM address shows that the memory cell under the test belongs to the reserve cell area 110.

The OR 624 outputs the signal INH to the OR 618, calculating logical OR among the outputs of the AND circuits 622. The signal INH output to the OR 618 becomes H when at least one of the outputs of the AND circuits 622 becomes "1".

FIGS. 11(a) to 11(d) show the process of storing fail information to the SBFM 614 according to one embodiment of the present invention. FIG. 11(a) shows sub block addresses in the remedial block 140. In the remedial block 140, addresses #0 to #F are assigned to the sub blocks in the main cell area 120, addresses #10, #14, #1B and #1C are assigned to sub blocks of the spare row 110A, and address #20, #21, #22 and #23 are assigned to sub blocks in the spare column 110B.

The INHREG 620 observes the address bits that have values characteristic of the sub blocks outside the main cell area 120. In this embodiment, the INHREG 620 outputs the value #30 to a plurality of AND circuits 622, to which the addresses of the sub block inside the remedial block 140 are applied and outputs logic L to the other AND circuits 622. The sub block address #10 belonging to the 110A, and the sub block address #20 belonging to the spare column 110B are detected.

For example, at least one of the AND circuits 622 will output logic H when the sub block address is either #10, #14, #1B, #1C, #20, #21, #22 and #23, that is, when the sub block belongs to the reserve cell area 110. The output of the OR 624 becomes H, and the OR 618 outputs logic H even when the input fail obtaining signal /SDR is L. It is prohibited for the SBFM 614 to store the fail information. Accordingly, the SBFM 614 does not store any fail information concerning the sub blocks belonging to the reserve cell area 110. It should be noted that the areas corresponding to the addresses #10, #14, #1B, #1C, #20, #21, #22 and #23 shown in FIG. 11(*a*) are drawn for explanation purposes only. These areas do not exist in the actual implementation of the SBFM 614.

All of the AND circuits 622 output logic L when the sub block analysis is either one of #0 to #F, that is, when the sub block belongs to the main cell area 120. The OR 624 outputs logic L signal INH. The OR 618 outputs logic L signal when the fail obtaining signal /STR is L. The SBFM 614 stores as the fail information the logic H, applied to the terminal Dn in the location corresponding to the sub block address input from the SBFM address selector 610 via the terminal An. Accordingly, the fail information with regard to the sub blocks belonging to the main cell area 120 is safely stored.

FIG. 11(*b*) shows sub blocks whose fail information was stored in the SBFM 614. The hatched area in the figure shows sub blocks whose fail information was not stored in the SBFM 614, and the other area shows the sub blocks whose fail information was stored in the SBFM 614. The fail information concerning the sub blocks which belong to the reserve cell area 110 is not stored in the SBFM 614, and the fail information of the sub blocks belonging to the main cell area 120 is stored in the SBFM 614.

FIGS. 12(*a*)–12(*d*) show a fail information storing operation according to one embodiment of the present operation. FIG. 12(*a*) shows where the failed cell resides in the remedial block 140. In the figure, the numbers #0, #1 to #1F correspond to addresses of the remedial block 140. A round symbol "o" shows that the remedial block 140 has no failed cells, and an "x" symbol shows where there is at least one failed cell in the remedial block 140. FIG. 12(*b*) shows the internal structure of the remedial block 140, #19. This figure shows locations of the failed memory cells in the sub blocks of the main cell area 120 of the remedial block 140 #19. The numbers #0, #1 to #F show the address of each sub block. A round symbol "o" shows that the sub block has no failed cells, and an "x" symbol shows where there are failed cells in the sub block.

FIG. 12(*c*) shows the fail information stored in the BFM 612. Addresses such as #1, #5, #6 and #7 corresponding to the remedial block 140 with failed cells, are set to "1", and the other addresses of the remedial block such as #0, #2, #3, and #4 are set to "0".

FIG. 12(*d*) shows the fail information of the sub blocks stored in the SBFM 614. The addresses such as #1, #5, #9 and #D of the sub blocks in the main cell area 120 having a failed cell are set to "1" and the other addresses of the sub blocks such as #0, #2, #3 and #4 are set to "0".

FIGS. 13(*a*)–13(*d*) show a remedial analysis operation of the remedial analyzer 70 on the BFM 612 and SBFM 614, according to one embodiment of the present invention.

The analyzing section 70D reads out the first bit according to the start address of the BFM 612. When the first bit shows that there are no failed cells, the analyzing section 70D reads out the next bit according to the next address. This is the skipping operation shown in FIG. 13(*a*). Conversely, when the first bit shows that there is a failed cell, the analyzing section 70D reads out the fail information of each memory cell of the reserve area 110 which belongs to the remedial block 140 corresponding to the start address. The analyzing section 70D counts the aforementioned three types of failed memory cells, and stores them in the RFCM 70A, TFCM, 70B and the CFCM 70C, respectively. This is the SCAN operation shown in FIG. 13(*a*).

When the bit read out of the BFM 612 shows that there is a failed cell, the analyzing section 70D reads out bits sequentially from the starting address of the sub block in the remedial block 140 corresponding to the address of the SBFM 614. The analyzing section 70D reads the next bit according to the next address when the first bit read out of the SBFM 614 shows that there are no failed cells. This is the skipping operation shown in FIG. 13(*b*), which occurs in the SCAN operation shown in FIG. 13(*a*).

The analyzing section 70D reads out the fail information of each memory cell belonging to the sub blocks according to the address when a bit read out of the SBFM 614 shows that there is a failed cell. The analyzing section 70D counts the three types of memory cells, and stores these numbers to the RFCM 70A, TFCM 70B and the CFCM 70C. This is the SCAN operation shown in FIG. 13(*b*), which occurs in the SCAN operation shown in FIG. 13(*a*). The analyzing section 70D correctly identifies the memory cell lines in the memory cell area 120 to be replaced, and the memory cell lines in the reserve cell area 110 to replace the failed memory cell lines. This identification is based on the counts stored in the RFCM 70A, TFCM 70B and the CFCM 70C.

According to the described device, the fail information of the sub blocks belonging to the reserve cell area 110 is not be stored in the SBFM 614. This makes a reduction of the capacity of the SBFM 61 possible. This also enables a reduction in the total amount of time necessary for the SCAN operation, as the SCAN operation is necessary only when the main cell area 120 actually includes a failed cell.

In the above embodiment, logic H or "1" is written in a location of the SBFM 614 according to the sub block address in order to store the fail information thereof, but this is not essential. The SBFM 614 may store the intact sub block address instead of the logic H.

Although the present invention has been described by way of exemplary embodiments, it should be understood that many changes and substitutions may be made by those skilled in the art without departing from the spirit and the scope of the present invention, which is defined only by the appended claims.

As one of these modifications, sub blocks belonging to the main cell area 120 may be detected, and fail information concerning these sub blocks may be stored. In the above embodiment, sub blocks outside the main cell area 120 are detected, and the fail information concerning these sub blocks is prohibited from being stored.

Although the present invention has been described by way of exemplary embodiments, it should be understood that many changes and substitutions may be made by those skilled in the art without departing from the spirit and the scope of the present invention which is defined only by the appended claims.

What is claimed is:

1. A device for obtaining fail cell identification information of a semiconductor memory having blocks with remedial function with a main cell area having memory cells and a reserve cell area having reserve cells for replacing failed memory cells, the fail cell identification information indicating a failed memory cell, comprising:

an input section for inputting the fail cell identification information;

a memory for storing fail cell specification information to specify location of a failed memory cell indicated by the fail cell identification information;

a block information memory for storing block specification information indicating a remedial block to which the failed memory cell indicated by the fail cell identification information belongs;

a sub block identification information selector for outputting sub block identification information indicating a sub block of the remedial block to which the failed memory cell belongs, indicated by the fail cell identification information;

a detector for detecting whether the failed memory cell indicated by the fail cell identification information belongs to one selected from the main cell area and said reserve cell area; and a sub block information memory for storing a sub block specification information specifying the sub block indicated by the sub block identification information only when the failed memory cell indicated by the fail cell identification information is detected to belong to the main cell area by said detector.

2. The device of claim 1, wherein the sub block information memory stores the sub block specification information, utilizing an address bit corresponding to the sub block identification information output.

3. The device of claim 1, wherein the selector selects as the sub block identification information a plurality of predetermined bits of the fail cell identification information.

4. The device of claims 1, wherein the detector detects whether the failed memory cell belongs to the main cell area, based on a predetermined bit of the fail cell identification information.

5. The device of claim 4, wherein the detector comprises a logical AND circuit for calculating logical AND of the predetermined bit of the fail cell identification information and a predetermined logic value and wherein whether the failed memory cell indicated by the fail cell identification information belongs to one selected from the main cell area and said reserve cell area is detected based on result of the logical AND operation.

6. The device of claim 5, wherein the predetermined bit is a bit, the value of which becomes constant for addresses inside the main cell area.

7. The device of claim 5, wherein the predetermined bit is a bit, the value of which becomes constant for addresses outside the main cell area.

8. A tester for testing a semiconductor memory having blocks with remedial function with a main cell area having memory cells and a reserve cell area having reserve cells for replacing failed memory cells, comprising:

a pattern generator for generating a test pattern to apply to the semiconductor memory, identification information corresponding to the memory cells in the semiconductor memory and expected data to be output therefrom when the memory cells are normal;

a waveform shaper for shaping the test pattern signal;

a logic comparator for comparing output data output from the semiconductor memory when the shaped test pattern is applied thereto and the expected data;

an input section for inputting the identification information as fail cell identification information when the output data and the expected data mismatch;

a memory for storing fail cell specification information to specify the memory cell indicated by the fail cell identification information;

a block information memory for storing block specification information indicating a remedial block to which the failed memory cell indicated by the fail cell identification information belongs;

a sub block identification information selector for outputting sub block identification information indicating a sub block of the remedial block to which the failed memory cell belongs, indicated by the fail cell identification information;

a detector for detecting whether the failed memory cell indicated by the fail cell identification information belongs to one selected from the main cell area and said reserve cell area; and a sub block information memory for storing a sub block specification information specifying the sub block indicated by the sub block identification information only when the failed memory cell indicated by the fail cell identification information is detected to belong to the main cell area by said detector.

9. The tester of claim 8, wherein the sub block information memory stores the sub block specification information, utilizing an address bit corresponding to the output sub block identification information.

10. The tester of claim 8, wherein the sub block identification information selector selects as the sub block identification information a plurality of predetermined bits of the fail cell identification information.

11. The tester of claim 8, wherein the detector detects whether the failed memory cell belongs to the main cell area or not based on a predetermined bit of the fail cell identification information.

12. The tester of claim 11, wherein the detector comprises a logical AND circuit calculating logical AND of the predetermined bit of the fail cell identification information and a predetermined logic value and wherein whether the failed memory cell indicated by the fail cell identification information belongs to the main cell area or not is detected based on result of the logical AND operation.

13. The tester of claim 12, wherein the predetermined bit is a bit, the value of which becomes constant for addresses inside the main cell area.

14. The testers of claim 12, wherein the predetermined bit is a bit, the value of which becomes constant for addresses outside the main cell area.

15. A method of obtaining fail cell identification information of a semiconductor memory having blocks with remedial function with a main cell area having memory cells and a reserve cell area, the fail cell identification information indicating a failed memory cell, comprising:

obtaining the fail cell identification information;

storing fail cell specification information to specify location of a failed memory cell indicated by the fail cell identification information;

storing information indicating a remedial block to which the failed memory cell indicated by the fail cell identification information belongs;

obtaining sub block identification information indicating a sub block of the remedial block to which the failed memory cell belongs indicated by the fail cell identification information;

detecting whether the failed memory cell indicated by the fail cell identification information belongs to one selected from the main cell area and said reserve cell area; and specifying the sub block indicated by the sub block identification information only when the failed memory cell indicated by the fail cell identification information is detected to belong to the main cell area by said detector.

16. The method of claim 15, wherein whether the failed memory cell belongs to the main cell area or not is detected based on a predetermined bit of the fail cell identification information.

17. The method of claim 16, wherein the predetermined bit is a bit, the value of which becomes constant for addresses inside the main cell area.

18. The method of claim 16, wherein the predetermined bit is a bit, the value of which becomes constant for addresses outside the main cell area.

19. A method for analyzing a semiconductor memory having blocks with remedial function with a main cell area having memory cells and a reserve cell area having reserve memory cells for replacing failed memory cells, the method analyzing the reserve memory cell, comprising:

reading out pre-recorded block specification information indicating a remedial block to which the failed memory cell indicated by the fail cell identification information belongs;

analyzing, based on pre-recorded fail memory cell identification information, the reserve memory cell in the remedial block corresponding to the block specification information;

reading out, out of pre-recorded sub block specification information indicating a sub block having a remedial block having a main cell area including a failed memory cell therein, a sub block specification information indicating, a sub block having a remedial block corresponding to the block specification information, the remedial block having a main cell area including a failed memory cell therein; and analyzing, based on the failed memory cell identification information, the failed memory cell in the main cell area in the sub block corresponding to the read sub block specification information.

20. The method of claim 19, further comprising detecting the reserve memory cell in the reserve cell area to replace the failed memory cell in the main cell area, based on the analysis of the reserve memory cell in the reserve cell area and the analysis of the failed memory cell in the main cell area.

* * * * *